Nov. 28, 1961 R. BRAY 3,011,067

SEMICONDUCTOR RECTIFYING DEVICE HAVING NON-RECTIFYING ELECTRODES

Filed Oct. 25, 1955

INVENTOR.
RALPH BRAY
BY
W.S. Hill
AGENT

United States Patent Office 3,011,067

Patented Nov. 28, 1961

3,011,067

SEMICONDUCTOR RECTIFYING DEVICE HAVING NON-RECTIFYING ELECTRODES

Ralph Bray, Lafayette, Ind., assignor to Purdue Research Foundation, Lafayette, Ind., a corporation of Indiana Filed Oct. 25, 1955, Ser. No. 542,633
6 Claims. (Cl. 307—88.5)

Figure 1:
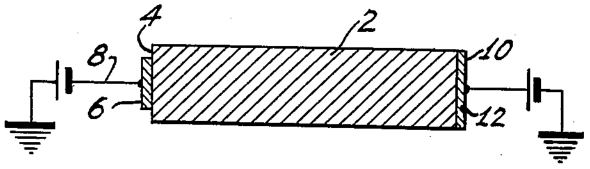

The present invention relates to improved semiconductor devices and, more particularly, to improved devices including low-resistance contact electrodes for semiconducting germanium bodies, which electrodes are capable of giving either improved minority carrier injection or extraction, depending upon operating conditions.

In contrast to the electrodes in the devices of the present invention, one type of rectifying electrode for germanium semiconductor devices has been made by alloying a quantity of any one of the conductivity-type-determining elements into a surface of a semiconducting germanium body. An example of making an electrode of this type has been to place a small disc of indium on an etched surface of an N-conductivity type germanium wafer, heat the assembly in a reducing atmosphere to a temperature sufficiently high to melt the indium and dissolve a part of the germanium, and then cool to re-crystallize the molten portion of the wafer. The re-crystallized portion becomes converted to P-type conductivity and a rectifying junction is formed between the P-type and the N-type regions.

An object of the present invention is to provide improved minority charge carrier injecting and extracting electrodes for semiconducting germanium.

Other objects of the invention are to provide improved semiconductor devices including the improved electrodes of the invention, and methods of making the devices.

In the present invention, although made by a method which somewhat resembles the above-described method of making rectifying electrodes, the electrodes are non-rectifying.

In general, the present invention comprises semiconducting devices including a body of semiconducting germanium having soldered, or otherwise secured in good contact, but not alloyed, to a surface thereof an electrode of tin or indium. The invention also includes processes of making the improved devices.

One form of devices of the present invention is particularly useful in extracting minority charge carriers from semiconducting germanium. The novel electrodes of the device can be used to limit the current of minority carriers entering the semiconductor body, while imposing no barrier to majority carriers. Consequently, when an electric field is established in the body, the minority carriers which are normally present in the interior can be swept out of the body at the collector contact without being replenished at the emitter contact. If the sweep-out rate is greater than the rate at which minority carriers are thermally regenerated in the body, then appreciable depletion of minority carrier concentration can be achieved throughout the body.

A feature of the present invention is improved semiconductor devices including electrodes capable of enhanced minority carrier extraction and, in some cases, also including electrodes capable of improved minority carrier injection. Other features of the invention are improved extraction electrodes and improved injection electrodes which may be used in these and other devices.

Figure 2:
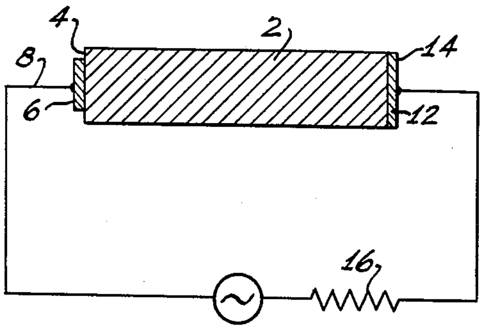

The invention will be described in greater detail by references to the accompanying drawing wherein:

FIGURE 1 is a cross sectional view of one form of device of the present invention, and FIGURE 2 is a cross sectional view of another device in accordance with the invention.

Similar parts are designated with like numbers throughout the drawing.

As an example of making one type of device in accordance with the present invention, a small wafer of germanium 2, preferably of single crystalline form and having a resistitivity of at least about 1 ohm cm., has one of its surfaces 4 ground and etched. The germanium may be P-type in conductivity, that is, have an excess of "holes" available for conduction purposes. P-type germanium may be prepared by alloying minute traces of any one of aluminum, gallium or indium with germanium of substantially intrinsic purity. The concentration of the "impurity" may be of the order of several atoms in 10,000,000 atoms of germanium, for example. Although neither the concentration nor the composition of the etching solution is particularly critical, a satisfactory etching solution may consist of 1 part by volume of an aqueous hydrofluoric acid solution containing 48% by weight hydrogen fluoride, 1 part by volume of a 30% by weight aqueous solution of hydrogen peroxide and 4 additional parts by volume of water. In this type of solution, the ratio of hydrogen fluoride to hydrogen peroxide may be between about 3:1 and 1:25. Another type of etching solution comprises 20 parts by volume glacial acetic acid, 10 parts concentrated nitric acid, 10 parts 48% hydrofluoric acid and 1 part bromine.

A small piece of pure indium 6 is then placed on the freshly etched surface, which has first been rinsed to remove all residual etching solution. Heat is then applied to the assembly such that the temperature of the indium is raised to slightly above 150° C. and such that the indium just melts. The source of heat is then removed to permit solidification of the indium which is now attached to the germanium surface. A wire lead 8 may be attached to the indium during the melting and re-freezing operation and an ordinary ohmic electrode 10 consisting of a nickel tab soldered to the germanium surface may be applied to the opposite surface 12 of the germanium wafer.

In order to obtain better wetting of the germanium surface by the indium, the etched germanium surface may be treated with a suitable flux, such as dilute hydrochloric acid before applying the indium.

In the above-described process, tin may be used instead of indium, the tin being attached to the germanium surface by heating the tin slightly above its melting temperature. The processing steps are otherwise essentially the same as for the indium electrode.

The indium electrode in the device which has been described above constitutes an improved extraction type electrode. It can be used as an essential part of various rectifying and photo devices. With this type of electrode almost complete depletion has been obtained with electric fields under 50 volts/cm. applied across electrodes 6 and 10, electrode 6 being biased in the forward direction and electrode 10 being biased in the reverse direction as shown on germanium bodies 1 to 2 cm. in length, having a minority carrier lifetime of the order of 100 microseconds and resistivity of 32 ohm.-cm. at room temperature. There has been obtained an increase of resistance by as much as a factor of about 13 at 65° C., corresponding to extraction of about 90% of all carriers. A pulsed D.-C. field may also be used instead of a steady state voltage, with the voltage ranging from about 2.5 to 50 volts/cm.

An improved injection type electrode can be made in accordance with the invention by soldering a small quantity of indium or tin to a body of N conductivity type germanium. The N-type germanium can be made by any conventional process such as allowing any one of arsenic, antimony, bismuth or phosphorus with high resistivity germanium. The ratio of "impurity" element to germanium may be of the order of a few atoms of the former to 10,000,000 of the latter.

The tin-on-germanium type electrode which has been described can have its extraction characteristic converted to injection and its injection characteristic changed to extraction. For example, if the extraction type electrode comprising tin soldered to P-type germanium is heated above 300° C. in air for a few minutes it is converted to an injection type electrode. And, if the injection type electrode, i.e., tin soldered to N-type germanium is similarly heated, it is converted to an extraction type electrode. In no case are the electrodes rectifying in nature.

Behavior of any of the contact electrodes, made as above-described, may be tested as follows.

If the contact area is intensely illuminated while the device is on open circuit, a photovoltage is generated. The metal side is always positive for an injecting contact on N-type germanium and for an extracting contact on P-type. Negative metal polarity is observed for the two opposite cases.

Electrodes made in accordance with the present invention can be utilized in an unique rectifying apparatus in which rectification takes place within the bulk of a semiconductor body rather than at some interface or thin layer. As an example of use of this type of device, the device of FIGURE 1 may be utilized in the rectifying circuit of FIGURE 2. In a more desirable arrangement, the ohmic electrode 10 can be replaced by an injecting electrode 14 of the present invention. This may be made by first soldering a tab made of tin to the body to make an extracting electrode and then heating this electrode for a few minutes at about 300° C., which converts it to an injecting electrode.

When an A.C. signal is applied across the two electrodes, a rectified current appears across the load 16. The bulk resistance of the semiconductor body is modulated, hole electron pairs being swept from the body for one direction of current but not the other. In the embodiment described, forward bias on the small area electrode depletes the concentration of thermally or optically generated hole-electron pairs from the spreading resistance region, thus increasing the resistance. Reverse bias on the same electrode gives only the normal resistance.

Bulk rectifiers of the type described above have the advantage of simplicity and ease of manufacture. Also, the rectification ratio increases with light or heat, contrary to usual rectifier behavior.

What is claimed is:

1. A method of making a bulk rectifier comprising soldering an electrode of relatively small area and consisting of substantially pure tin to one surface of a body of P-type conductivity semiconducting germanium of nearly intrinsic purity, soldering a large area electrode of said tin to another surface of said body, both of said soldering operations being carried out by heating said tin to a temperature slightly above its melting point and immediately thereafter removing the heat therefrom to permit the tin to solidify, and heating said large area soldered contact to about 300° C. for a few minutes.

2. A semiconducting device comprising a body of semiconducting germanium of nearly intrinsic purity of a single conductivity type, electrodes consisting only of a small area electrode of substantially pure tin soldered to one portion of said body and a large area electrode of substantially pure tin soldered to another portion of said body.

3. A semiconductor rectifying device comprising a body of semiconducting material of a single conductivity type, a first non-rectifying electrode means connected to said body for inhibiting injection of minority charge carriers into said body, a second non-rectifying electrode means connected to said body for injecting minority charge carriers into said body, said electrodes imposing no barrier to majority carriers and electric field producing means for sweeping minority charge carriers through said body in a direction away from said first electrode and toward said second electrode.

4. A method of making a semiconductor device comprising grinding and etching a surface of a body of semiconducting germanium, and soldering to said etched surface to make non-rectifying contact therewith, an electrode of substantially pure material selected from the class consisting of indium and tin by heating said material to a temperature slightly above its melting point and immediately thereafter removing the heat therefrom to permit said material to solidify.

5. A method according to claim 4 in which said electrode material is indium.

6. A method according to claim 4 in which said electrode material is tin.

References Cited in the file of this patent

UNITED STATES PATENTS

| | | |
|---|---|---|
| 2,556,991 | Teal | June 12, 1951 |
| 2,629,672 | Sparks | Feb. 24, 1953 |
| 2,644,852 | Dunlap | July 7, 1953 |
| 2,646,536 | Benzer et al. | July 21, 1953 |
| 2,655,608 | Valdes | Oct. 13, 1953 |
| 2,655,609 | Shockley | Oct. 13, 1953 |
| 2,680,220 | Starr et al. | June 1, 1954 |
| 2,684,457 | Lingel | July 20, 1954 |
| 2,697,052 | Dacey | Dec. 14, 1954 |
| 2,702,360 | Giacoletto | Feb. 15, 1955 |
| 2,730,663 | Harty | Jan. 10, 1956 |
| 2,731,704 | Spanos | Jan. 24, 1956 |
| 2,761,020 | Shockley | Aug. 28, 1956 |
| 2,796,562 | Ellis et al. | June 18, 1957 |
| 2,801,348 | Pankove | July 30, 1957 |
| 2,805,347 | Haynes et al. | Sept. 3, 1957 |